United States Patent
Tran et al.

(10) Patent No.: US 8,012,774 B2
(45) Date of Patent: Sep. 6, 2011

(54) COATING PROCESS FOR A LIGHT-EMITTING DIODE (LED)

(75) Inventors: Chuong A. Tran, Baoshan Township, Hsinchu County (TW); Trung T. Doan, Baoshan Township, Hsinchu County (TW); Jui-Kang Yen, Taipei (TW); Yung-Wei Chen, Taichung (TW)

(73) Assignee: SemiLEDs Optoelectronics Co., Ltd., Chu-Nan (TW)

( * ) Notice: Subject to any disclaimer, the term of this patent is extended or adjusted under 35 U.S.C. 154(b) by 372 days.

(21) Appl. No.: 11/530,128

(22) Filed: Sep. 8, 2006

(65) Prior Publication Data

US 2007/0001178 A1    Jan. 4, 2007

Related U.S. Application Data

(63) Continuation-in-part of application No. 11/032,853, filed on Jan. 11, 2005, now Pat. No. 7,195,944.

(51) Int. Cl.
*H01L 21/00* (2006.01)
(52) U.S. Cl. .............................. 438/22; 438/33; 257/79
(58) Field of Classification Search .................. 313/512; 438/33, 22; 257/79
See application file for complete search history.

(56) References Cited

U.S. PATENT DOCUMENTS

| | | | |
|---|---|---|---|
| 5,998,925 A | 12/1999 | Shimizu et al. | |
| 6,504,181 B2 | 1/2003 | Furukawa et al. | |
| 6,576,488 B2 | 6/2003 | Collins, III et al. | |
| 6,642,652 B2 | 11/2003 | Collins, III et al. | |
| 6,744,196 B1 | 6/2004 | Jeon | |
| 7,045,956 B2 | 5/2006 | Braune et al. | |
| 2002/0076904 A1* | 6/2002 | Imler | 438/462 |
| 2002/0089058 A1* | 7/2002 | Hedler et al. | 257/737 |
| 2002/0185965 A1* | 12/2002 | Collins et al. | 313/501 |
| 2004/0077114 A1* | 4/2004 | Coman et al. | 438/46 |
| 2004/0245543 A1* | 12/2004 | Yoo | 257/103 |
| 2005/0173692 A1* | 8/2005 | Park et al. | 257/13 |
| 2006/0003477 A1* | 1/2006 | Braune et al. | 438/29 |
| 2006/0061259 A1* | 3/2006 | Negley | 313/499 |

FOREIGN PATENT DOCUMENTS

WO  WO/2004/040661  *  5/2004

OTHER PUBLICATIONS

PCT International Search Report dated May 14, 2008.

* cited by examiner

*Primary Examiner* — Marcos D. Pizarro
*Assistant Examiner* — Eva Yan Montalvo
(74) *Attorney, Agent, or Firm* — Patterson & Sheridan, L.L.P.

(57) ABSTRACT

A light emitting diode (LED) device having a substantially conformal wavelength-converting layer for producing uniform white light and a method of making said LED at both the wafer and individual die levels are provided. The LED device includes a metal substrate, a p-type semiconductor coupled to the metal substrate, an active region coupled to the p-type semiconductor, an n-type semiconductor coupled to the active region, and a wavelength-converting layer coupled to the n-type semiconductor.

14 Claims, 7 Drawing Sheets

COATING PROCESS FOR A LIGHT-EMITTING DIODE (LED)

CROSS-REFERENCE TO RELATED APPLICATIONS

This application is a continuation-in-part of U.S. patent application Ser. No. 11/032,853, filed Jan. 11, 2005 now U.S. Pat. No. 7,195,944, herein incorporated by reference in its entirety.

BACKGROUND OF THE INVENTION

1. Field of the Invention

Embodiments of the present invention generally relate to a light-emitting diode and a method for fabricating the same.

2. Description of the Related Art

Advances in light emitting diode (LED) technology have resulted in LEDs with characteristics of small volume, light weight, high efficiency and long life. These LEDs have seen great advances in different monochromatic color output, such as red, blue and green. Single color LEDs can be used as a backlight in a special display, for instance, in mobile phones and light crystal displays (LCDs).

Recently, various attempts have been made to make white light sources by using light emitting diodes. Because the light emitting diode has an emission spectrum well-suited to generate monochromatic light, making a light source for white light requires arranging three light emitting components of red (R), green (G), and blue (B) near each other while diffusing and mixing the light emitted by them. When generating white light with such an arrangement, there has been the problem that white light of the desired tone cannot be generated due to variations in the tone, luminance, and other factors of the light emitting component. Also, when the LEDs are made of different materials, electric power required for forward biasing differs from one light emitting diode to another, making it necessary to apply different voltages to different light emitting components, which leads to complex drive circuitry. Moreover, because the light emitting components are semiconductor light emitting components, color tone is subject to variation due to differences in temperature characteristics, chronological changes, and operating environment. Unevenness in color may also be caused by failure to uniformly mix the light emitted by the light emitting components. Thus, LEDs are effective as light emitting devices for generating individual colors, but a satisfactory light source capable of emitting white light by using LEDs has not been obtained so far.

U.S. Pat. No. 5,998,925 discloses a white light emitting diode having a light emitting component that uses a semiconductor as a light emitting layer and a phosphor, which absorbs part of the light emitted by the light emitting component and emits light of a wavelength different from that of the absorbed light. The light emitting layer of the light emitting component is a nitride compound semiconductor, and the phosphor contains garnet fluorescent material activated with cerium—which contains at least one element selected from the group consisting of Y, Lu, Sc, La, Gd and Sm and at least one element selected from the group consisting of Al, Ga, and In—and is subject to less deterioration of its emission characteristics, even when used with high luminance for a long period of time.

FIG. 1 shows an LED as disclosed in the '925 patent. This LED is a lead-type LED having a mount lead 2 and an inner lead 4, wherein a light emitting component 8 is installed on a cup 6 of the mount lead 2, and the cup 6 is filled with a coating resin 14 that contains a specified phosphor to cover the light emitting component 8 and is molded in resin. An n-electrode and a p-electrode of the light emitting component 8 are connected to the mount lead 2 and the inner lead 4, respectively, by means of wires 12. In the LED constituted as described above, part of the light emitted by the light emitting component (LED chip) 8 (hereinafter referred to as LED light) excites the phosphor contained in the coating resin 14 to generate fluorescent light having a wavelength different from that of LED light, so that the fluorescent light emitted by the phosphor and the LED light that is output without contributing to the excitation of the phosphor are mixed and output. As a result, the LED also outputs light having a wavelength different from that of the LED light emitted by the light emitting component 8.

FIG. 2 shows a chip embodiment as disclosed in the '925 patent. The chip-type LED 26 is installed in a recess of a casing 22, which is filled with a coating material containing a specified phosphor to form a coating 28. The light emitting component 26 is fixed by using an epoxy resin or the like which contains Ag, for example, and an n-electrode and a p-electrode of the light emitting component 26 are connected to metal terminals 20 installed on the casing 22 by means of conductive wires 24. In the chip-type LED constituted as described above, similar to the lead-type LED of FIG. 1, fluorescent light emitted by the phosphor and LED light that is transmitted without being absorbed by the phosphor are mixed and output, so that the LED outputs light having a wavelength different from that of LED light emitted by the light emitting component 26. This type of conventional LED suffers from a color ring when used for emitting white light, whereby the color of the emitted light is bluer towards the middle and tends toward yellow at the edges near the casing 22.

U.S. Pat. No. 6,642,652 discloses a light source that includes a light emitting device—such as a III-nitride LED where Group 3 (III) includes such elements as Al, Ga, and In—covered with a luminescent material structure, such as a single layer or multiple layers of phosphor. Any variations in the thickness of the luminescent material structure are less than or equal to 10% of the average thickness of the luminescent material structure. In some embodiments, the thickness of the luminescent material structure is less than 10% of a cross-sectional dimension of the light emitting device. In some embodiments, the luminescent material structure is the only luminescent material through which light emitted from the light emitting device passes. In some embodiments, the luminescent material structure is between about 15 and about 100 microns thick. The luminescent material structure is selectively deposited on the light emitting device, for example, by stenciling or electrophoretic deposition.

An LED coated with phosphor according to the '652 patent is illustrated in FIG. 3. This LED includes an n-type region 44 formed on a substrate 42, such as sapphire, SiC, or a III-nitride material. An active region 46 is formed on the n-type region 44, and a p-type region 36 is formed on the active region 46. The n-type region 44, the active region 46, and the p-type region 36 are typically multilayer structures. Portions of the p-type region 36, the active region 46, and the n-type region 44 are etched away to expose a portion of n-type region 44. A p-type contact 34 is deposited on the p-type region 36, and an n-type contact 38 is deposited on the exposed portion of the n-type region 44. The LED is then flipped over and mounted to a sub-mount 30 by a material 32, such as solder. The luminescent material structure 40, such as phosphor, is deposited using electrophoresis to surround the LED at the individual die level.

U.S. Pat. No. 6,744,196 discloses thin film LED devices comprised of LED chips that emit light at a first wavelength and a tinted thin film layer over the LED chip that changes the color of the emitted light. For example, a blue-light emitting LED chip can be used to produce white light. The tinted thin film layer beneficially consists of ZnSe, $CeO_2$, $Al_2O_3$, or $Y_2O_3Ce$ that is deposited using a chemical vapor deposition (CVD) process, such as metal organic chemical vapor deposition (MOCVD), atomic layer chemical vapor deposition (ALD), plasma enhanced MOCVD, plasma enhanced ALD, and/or photo enhanced CVD. As shown in FIG. 4, an n-contact 50 is positioned below a reflective layer 52. A tinted layer (a phosphor layer) 53 is positioned above the reflective layer 52. Next, a first passivation layer 54 is formed, and a p-type semi-transparent contact 56 is formed. A second passivation layer 58 is formed above the first passivation layer 54 and contact 56. A conductive wire 60 is connected to a p-pad 62, which is positioned above the p-lead 64.

Accordingly, what is needed is an improved semiconductor light source capable of emitting white light.

SUMMARY

One embodiment of the invention provides a light emitting diode (LED) structure. The LED structure generally includes a metal substrate, a p-type semiconductor coupled to the metal substrate, an active region coupled to the p-type semiconductor, an n-type semiconductor coupled to the active region, and a wavelength-converting layer coupled to at least a portion of the n-type semiconductor.

Another embodiment of the invention provides a method for fabricating an LED structure. The method generally includes providing a semiconductor structure disposed on a wafer and coupled to a metal substrate, the semiconductor structure comprising a p-type semiconductor, an active region coupled to the p-type semiconductor, and an n-type semiconductor coupled to the active region; depositing an n-contact on a surface of the n-type semiconductor; applying a wavelength-converting layer above at least a part of the n-type semiconductor; and dicing the wafer into separate LED structures.

Yet another embodiment of the invention provides a method for fabricating an LED structure. The method generally includes providing a semiconductor structure coupled to a metal substrate and an n-contact, the semiconductor structure comprising a p-type semiconductor, an active region coupled to the p-type semiconductor, and an n-type semiconductor coupled to the active region; bonding a wire configured for external connection to the n-contact; and applying a wavelength-converting layer above at least a part of the n-type semiconductor.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a light emitting diode (LED) device having a substantially conformal wavelength-converting layer for producing uniform white light and a method of making said LED at both the wafer and individual die levels.

An Exemplary LED Structure

Figure 1:
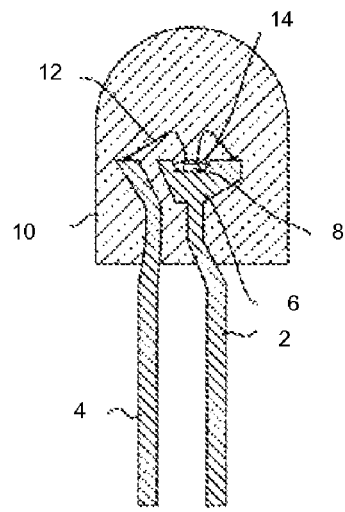
FIGS. 1-4 are cross-sectional schematic representations of prior art light-emitting diode (LED) structures.
Figure 2:
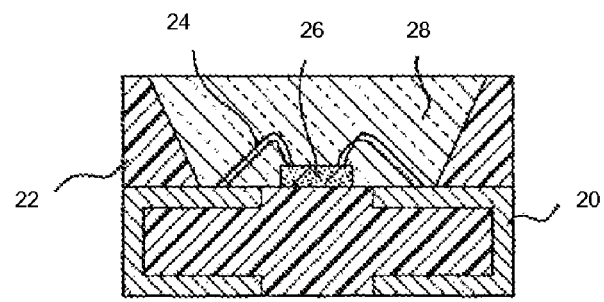
Figure 3:
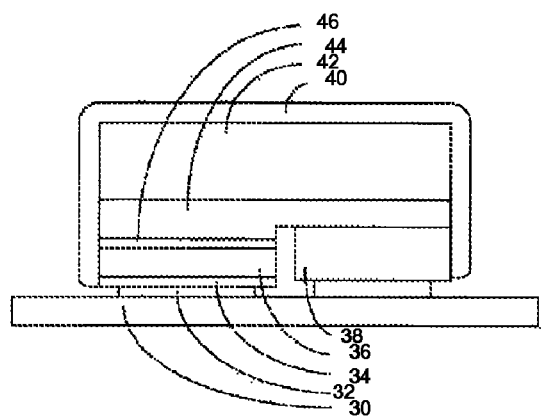
Figure 4:
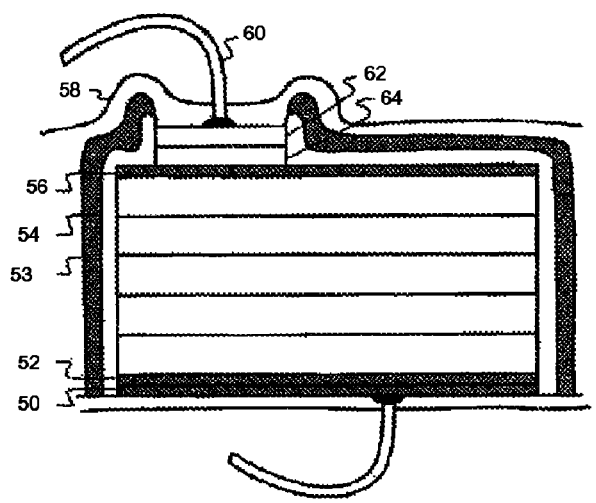
Figure 5A:
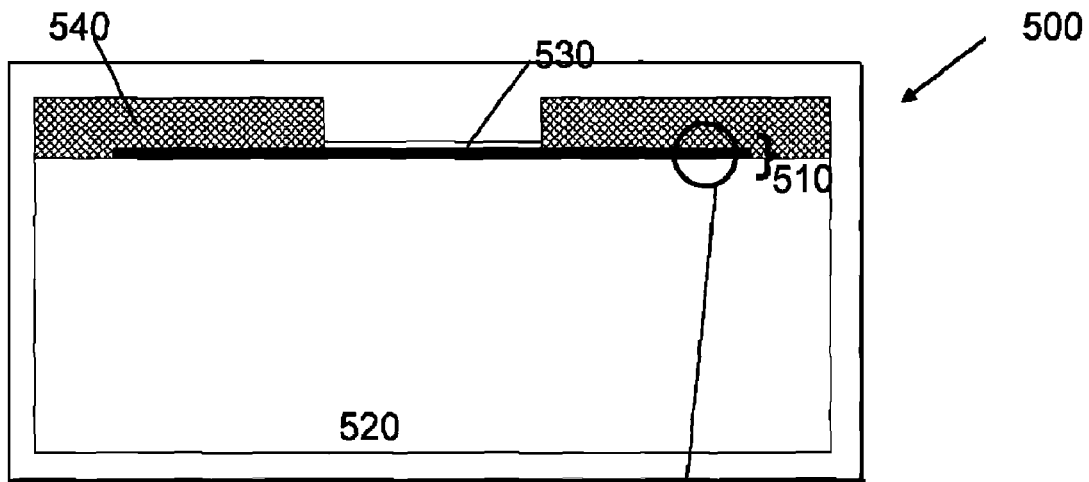
FIGS. 5A-B are cross-sectional schematic representations of an LED with a wavelength-converting layer in a normal and an exploded view according to one embodiment of the invention.

FIG. 5A depicts an exemplary structure of one embodiment of an LED device 500. The LED device 500 may include a semiconductor structure 510 disposed above a metal substrate 520. The metal substrate 520 may comprise a single layer or multiple layers of any suitable metal or metal alloy, such as Ag, Al, Au, Pd, Pt, Ni, Cu, Ti, or any combination thereof. The metal substrate 520 may be formed by electrochemical or electroless chemical deposition.

Comprising a p-type region 512, an active region 513, and an n-type region 514, the semiconductor structure 510 may be initially formed by depositing a multilayer epitaxial structure above a suitable carrier substrate (not shown), such as sapphire or SiC. The carrier substrate may be removed after the formation of the metal substrate 520, and removal may be accomplished according to any of several methods including the use of a laser, etching, grinding/lapping, chemical mechanical polishing, or wet etching, among others. For example, a sapphire carrier substrate may be removed using a laser lift-off (LLO) technique for some embodiments, while other embodiments may use etching to remove a SiC carrier substrate.

Figure 5B:
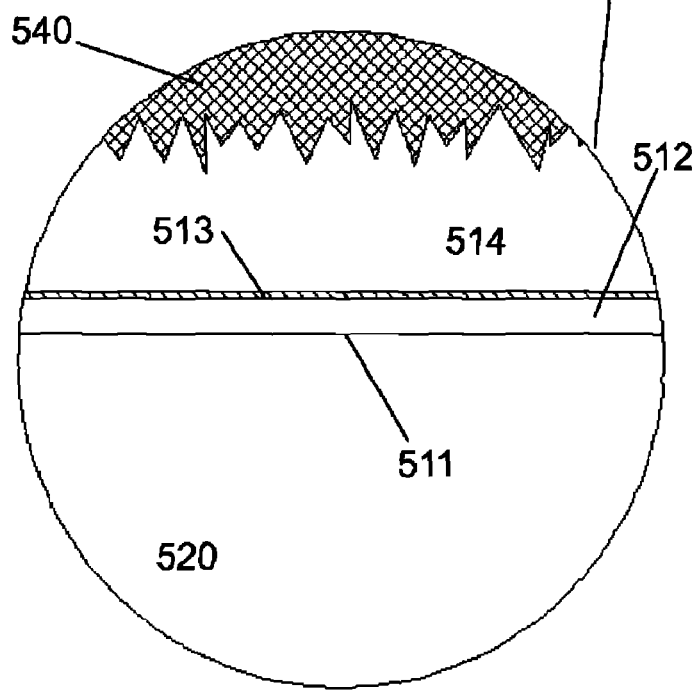

The details of the semiconductor structure 510 may be seen in the exploded view of FIG. 5B. A p-type semiconductor region 512 may be positioned above the metal substrate 520 and may comprise p-GaN. A reflective layer 511 may be interposed between the metal substrate 520 and the p-type region 512 in an effort to direct the emitted light from the LED device 500 in a single general direction, thereby improving luminous efficiency. The reflective layer 511 may contain suitable materials for reflecting light, such as Ag, Al, Ni, Pd, Au, Pt, Ti, Cr, Vd, or alloys of these metals. A light-emitting active region 513 (including a multi-quantum well) may be formed above the p-type region 512. The active region 513 may comprise $Al_xIn_yGa_{1-x-y}N$, where $0 \leq x \leq 1$ and $0 \leq y \leq 1-x$, and may emit light having a wavelength between 200 nm and 480 nm when the device 500 is forward biased.

An n-type semiconductor region 514 may be formed above the active region 513 and may comprise n-GaN. As shown in FIG. 5B, the surface of the n-type region 514 may be roughened in an effort to improve light extraction. The roughening of the surface of the n-type region 514 may be accomplished using any suitable method, including wet etching, dry etching, and photolithography with etching. An n-contact 530 may be formed above the surface of the n-type region 514. A wavelength-converting layer 540 may cover at least part of the surface of the n-type region 514.

The metal substrate 520 may be deposited using electrochemical deposition, electroless chemical deposition, chemical vapor deposition (CVD), metal organic CVD (MOCVD), plasma enhanced CVD (PECVD), atomic layer deposition (ALD), physical vapor deposition (PVD), evaporation, plasma spray, or suitable combinations of these techniques. The metal substrate 520 may be single or multi-layered. For some embodiments, Ag/Pt, Ag/Pd, or Ag/Cr may compose the first layer, Ni may compose the second layer potentially used as a barrier layer, and Au may compose the third layer. Other suitable metals, such as W, Cu, or Ni may also compose the third layer. In other embodiments, the metal substrate 520 may comprise three layers. A first layer (composed of Ag, Al, Pt, Ti, or Cr, for example) may be deposited, and then a second layer comprising materials such as TiN, TaN, TiWN, and TiW with oxygen as a barrier may be formed above the first layer. The third layer may comprise suitable conductive materials, such as Au, W, Cu, Ni, and other metals, and may be formed above the second layer.

Regarding the wavelength-converting layer 540, its purpose may be to accept light emitted from the active region 513 of the LED at one wavelength and emit light at a different wavelength, thereby producing a different color of light. As such, the wavelength-converting layer 540 may comprise a fluorescent material, such as phosphor, in an effort to emit white light from other colors generated by the active region 513. For some embodiments, the wavelength-converting layer 540 may comprise a single layer of phosphor and a binding material. Other embodiments may include a first transparent layer (not shown) that may comprise any suitable materials, such as a passivation layer or silicon dioxide, silicon nitride, titanium oxide, aluminum oxide, indium tin oxide (ITO), or polymer materials, and a second layer of phosphor and a binding material.

Exemplary Wavelength-Converting Layer Formation Methods at the Wafer Level

Figure 6:
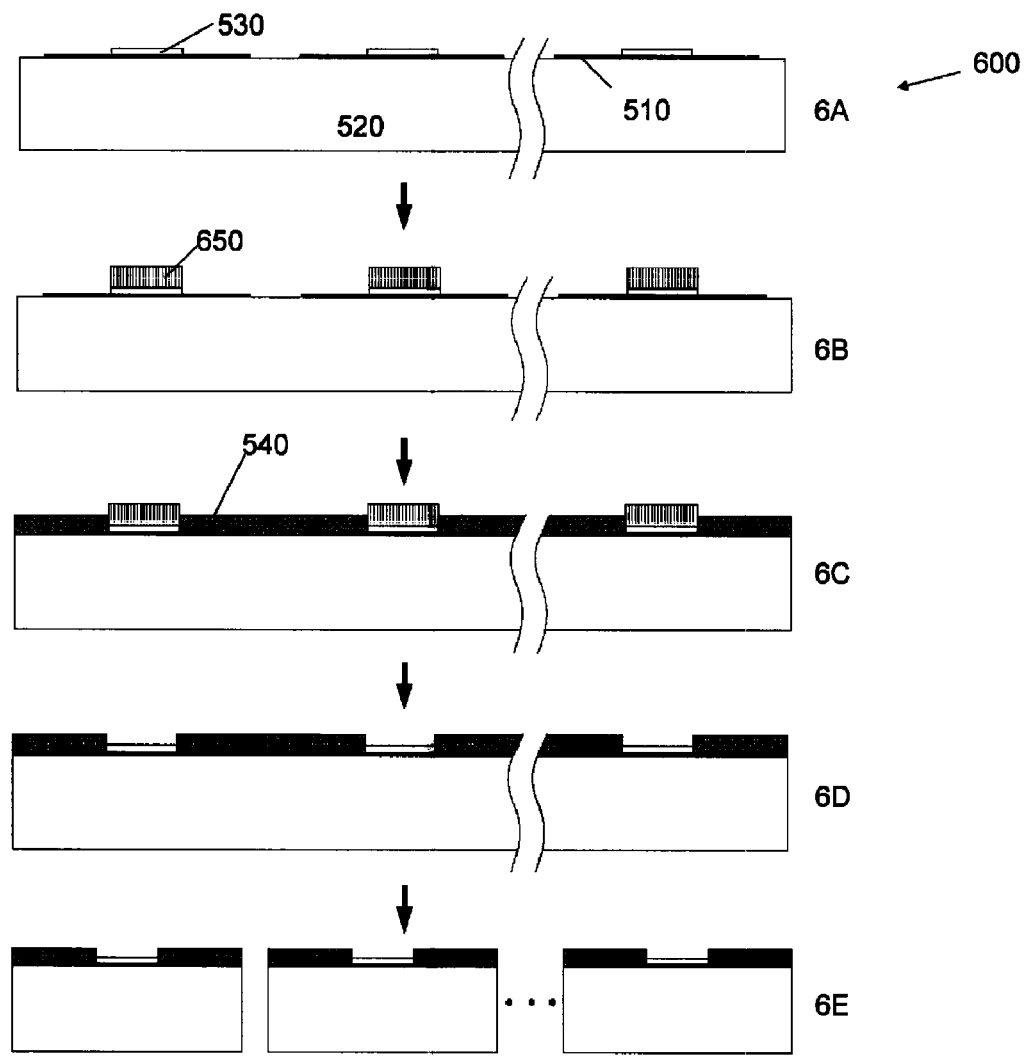
FIG. 6 is a process diagram depicting a method of applying a wavelength-converting layer to a wafer according to one embodiment of the invention.

FIG. 6 illustrates a method of forming the wavelength-converting layer 540 at the wafer level. After the LED semiconductor structure 510 has been formed on the carrier substrate, the metal substrate 520 has been formed, the carrier substrate has been removed, and n-contacts 530 have been added to the dies on the wafer 600 (6A), a temporary material, such as a photoresist 650, may be applied to the n-contacts 530 using a suitable method, such as lithography (6B). Next, the wavelength-converting layer 540 may be formed above the surface of the n-type semiconductor region 514 (6C). For some embodiments, all of the areas not covered by the photoresist layer 650 may be filled in with the wavelength-converting layer 540 on the surface of the wafer 600. However, care should be taken so that the height of the wavelength-converting layer 540 remains below the height of the photoresist layer 650.

Any of several methods may be employed to apply the wavelength-converting layer 540. For some embodiments, the wavelength-converting layer 540 may be formed using a spin coater. The spin coater may be operated between 500 to 30,000 rpm in an effort to control the layer thickness on the LED wafer 600. Although the spin coat method is preferable in an effort to obtain a predetermined equal film thickness, other methods, such as screen printing, dispensing, spray coating, inject printing, a roller method, or a dipping method, may be exercised.

To make the substance of the wavelength-converting layer 540, a mixture of phosphor powder and a binding material may be prepared. The phosphor powder may be surface-treated during the manufacturing process in an effort to improve the dispersing property and adhesion thereof. The binding materials may comprise silicone, epoxy, acrylic, or spin-on glass. The thickness of the wavelength-converting layer 540 may be reproducibly tuned by the mixture's viscosity and spin rate to change the resulting CIE (International Commission on Illumination) coordination of the LEDs to produce white light.

After the wavelength-converting layer 540 is formed on the wafer 600, the wafer 600 may be baked. The baking method is not limited as long as the moisture content of the wavelength-converting material is evaporated. Thus, various methods using a heater, an oven, dried air, or surface treatment such as a radiant heat lamp may be employed. After baking the wavelength-converting layer 540, the wavelength-converting layer 540 may be patterned in an effort to improve light extraction, and the photoresist layer 650 may be removed (6D). Then, the LED die on the wafer 600 may be diced and separated into individual components (6E).

Figure 7:
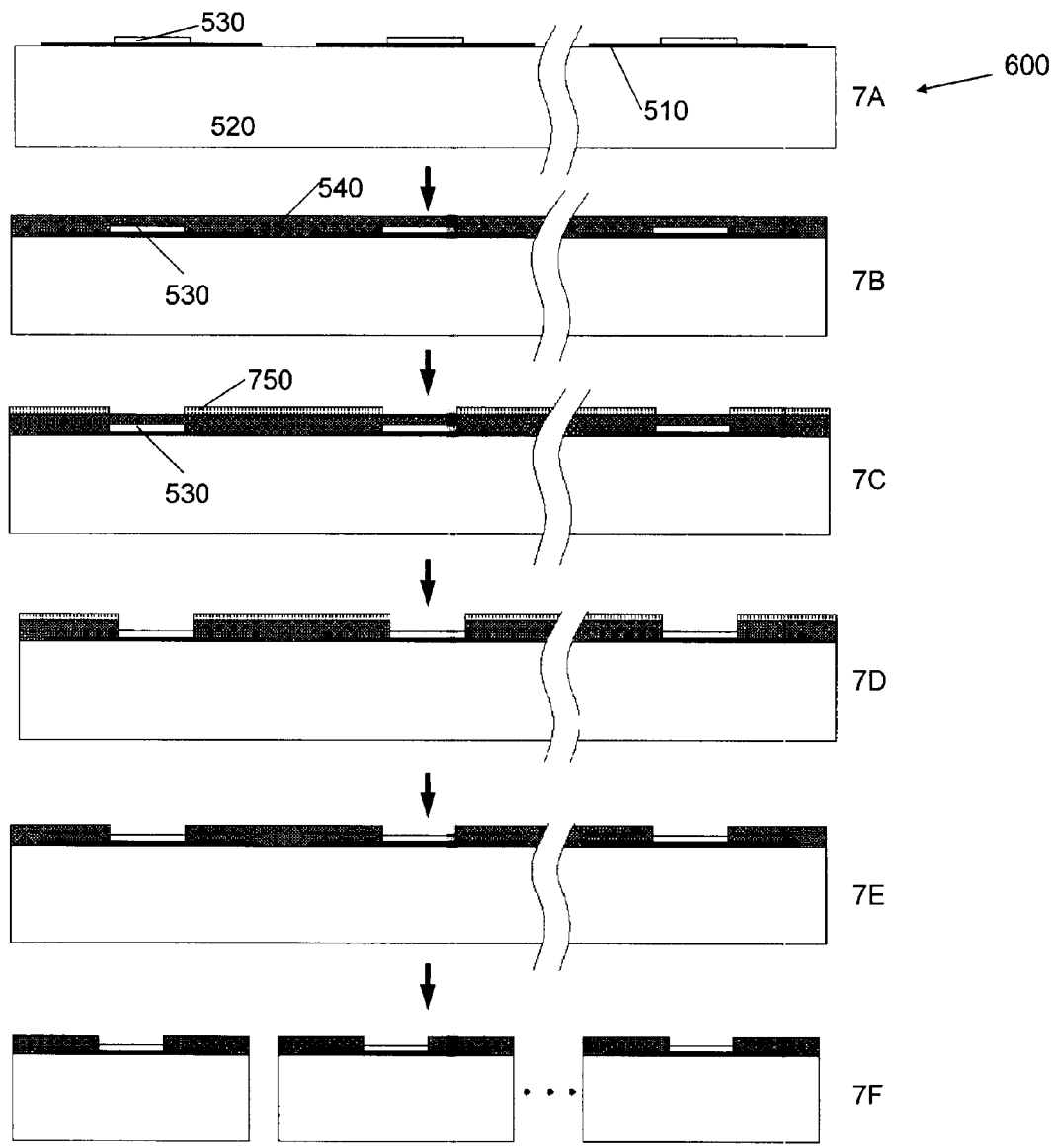
FIG. 7 is a process diagram depicting a method of applying a wavelength-converting layer to a wafer according to one embodiment of the invention.

FIG. 7 shows another method of applying the wavelength-converting layer 540 at the wafer level according to some embodiments of the invention. After the LED semiconductor structure 510 has been formed on the carrier substrate, the metal substrate 520 has been formed, the carrier substrate has been removed, and n-contacts 530 have been added to the dies on the wafer 600 (7A), the wavelength-converting layer 540 may be applied across the surface of the wafer 600 (7B). For some embodiments, the entire surface of the wafer 600 including the n-contacts 530 may be covered. Again, the wavelength-converting layer 540 may comprise a first transparent layer formed above the surface of the n-type semiconductor region 514 and a second layer with the phosphor and a binding material formed above the first layer.

A temporary protective layer 750, such as a photoresist, may be applied using any suitable means, such as lithography, on the wavelength-converting layer 540 (7C). For some embodiments, the protective layer 750 may be applied on the entire surface of the wavelength-converting layer 540, and the protective layer 750 may be removed or opened up in regions above the n-contacts 530. In other embodiments, the protective layer 750 may be applied to the surface of the wavelength-converting layer 540 everywhere except in regions above the n-contacts 530.

After the protective layer 750 has been applied and treated as necessary, the wavelength-converting layer 540 on and above the n-contacts 530 may be removed by any suitable method, such as wet etching or dry etching (7D). After portions of the wavelength-converting layer 540 have been removed, the protective layer 650 may be removed altogether (7E). Then, the LED die on the wafer 600 may be diced and separated into individual components (7F).

Exemplary Wavelength-Converting Layer Formation Methods at the Die Level

Figure 8:
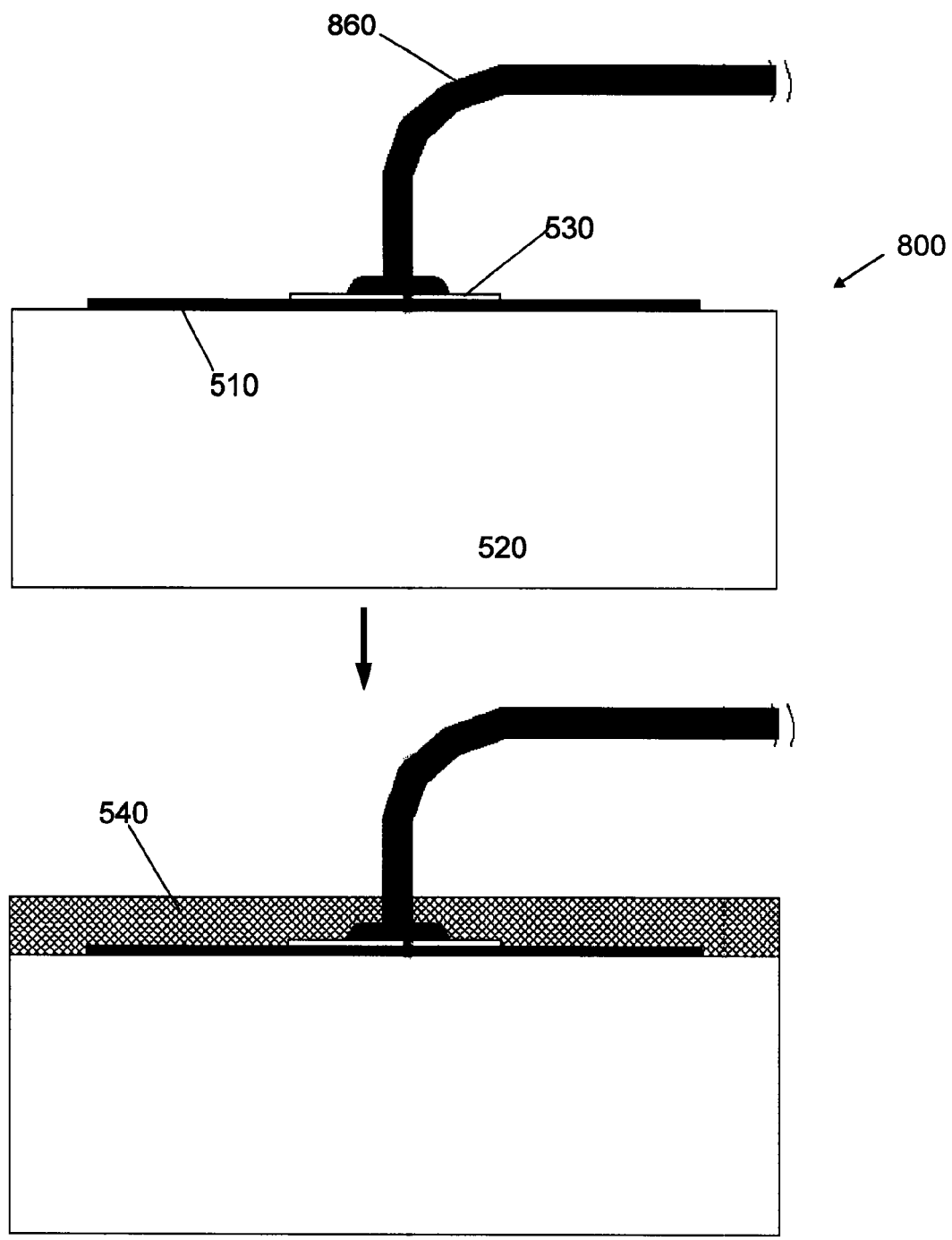
FIG. 8 is a process diagram depicting a method of applying a wavelength-converting layer to an individual light emitting device at the die level according to one embodiment of the invention.

Now that methods of forming the wavelength-converting layer 540 at the wafer level have been described, methods of forming the wavelength-converting layer 540 at the individual die level will be discussed. FIG. 8 illustrates a method of forming the wavelength-converting layer 540 on an individual LED device 800 after the wafer 600 has been diced and separated. The LED device 800 may have the LED semiconductor structure 510, metal substrate 520, and n-contact 530 described above. In addition, a lead wire 860 may be bonded to the n-contact 530 to provide an external electrical connection for the LED device 800.

After the addition of the lead wire 860, the wavelength-converting layer 540 may be formed according to different methods. For some embodiments, the wavelength-converting material may be applied by spray coating the top surface of the semiconductor structure 510 to form the wavelength-converting layer 540. In other embodiments, the wavelength-converting material may be dispensed as one or more drops on the surface of the semiconductor structure 510 and allowed to spread. In either case, the wavelength-converting layer 540 may be baked to evaporate the moisture content of the phosphor mixed with the binding material.

Figure 9:
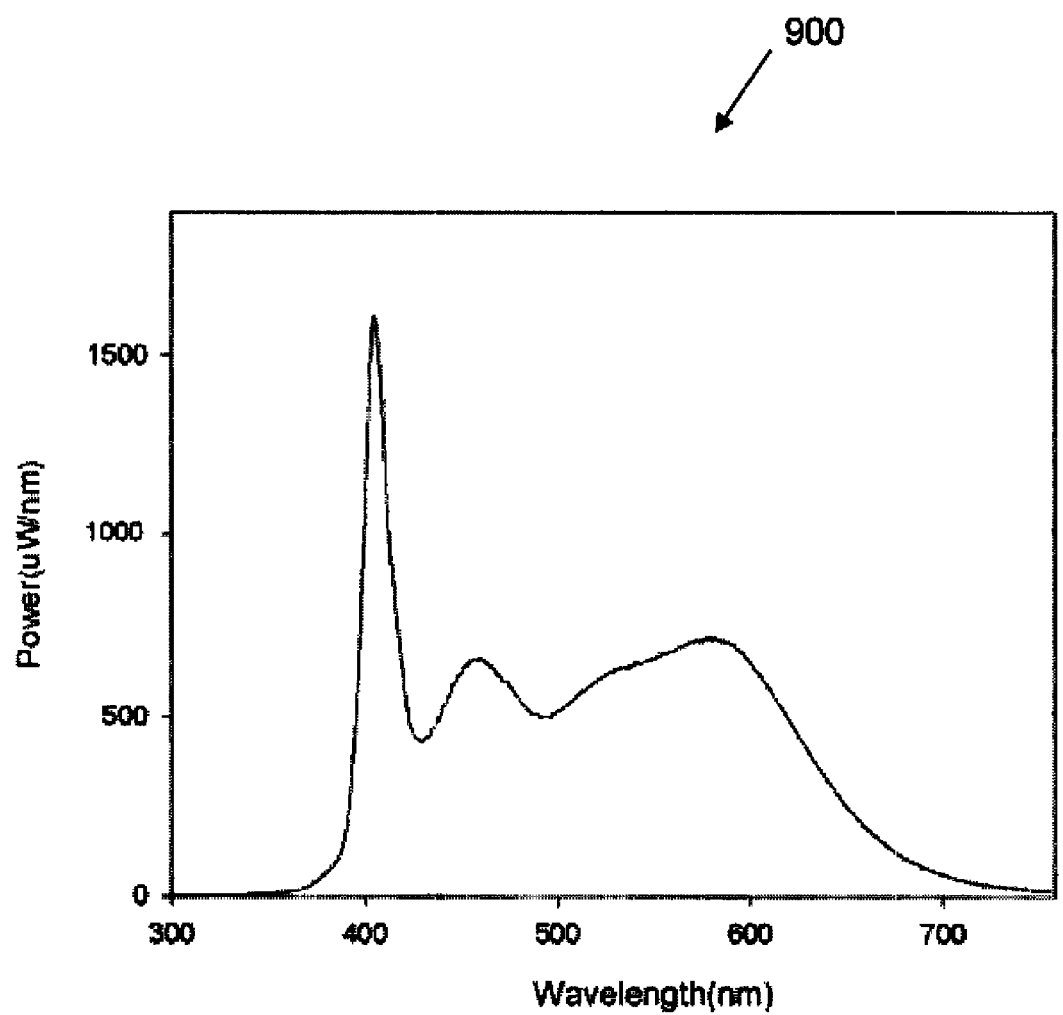
FIG. 9 is a graph of the optical spectrum of a forward biased LED according to one embodiment of the invention.

Although a single phosphor is described above, multiple fluorescent components may be employed in the wavelength-converting layer 540. Multiple phosphor components may produce a multi-peak wavelength spectrum. FIG. 9 illustrates an example spectrum 900 of a forward-biased LED device with a wavelength-converting layer 540 comprising multiple phosphor components.

While the foregoing is directed to embodiments of the present invention, other and further embodiments of the invention may be devised without departing from the basic scope thereof, and the scope thereof is determined by the claims that follow.

The invention claimed is:

1. A method for fabricating a light-emitting diode (LED) structure, comprising:
    providing a semiconductor structure disposed on a metal substrate formed by at least one of electrochemical deposition, electroless chemical deposition, chemical vapor deposition (CVD), metal organic CVD (MOCVD), plasma enhanced CVD (PECVD), atomic layer deposition (ALD), physical vapor deposition (PVD), evaporation, or plasma spray, the semiconductor structure comprising:
        a p-type semiconductor adjacent the metal substrate;
        an active region coupled to the p-type semiconductor; and
        an n-type semiconductor coupled to the active region;
    depositing an n-contact on a surface of the n-type semiconductor;
    applying a temporary material above the n-contact;
    applying a wavelength-converting layer above at least a part of the n-type semiconductor, wherein the surface of the n-type semiconductor is roughened before applying the wavelength-converting layer by at least one of wet etching, dry etching, or photolithography with etching;
    removing the temporary material; and
    dicing the semiconductor structure and the metal substrate into separate LED structures.

2. The method of claim 1, wherein the temporary material is a photoresist and is applied via lithography.

3. The method of claim 1, wherein the wavelength-converting layer is applied using at least one of spinning on, screen printing, dispensing, spray coating, and inject printing.

4. The method of claim 1, wherein applying the wavelength-converting layer comprises forming a first transparent layer and applying a second layer comprising at least a phosphor and a binding material.

5. The method of claim 4, wherein the first transparent layer is deposited using one of sputtering, chemical vapor deposition, or e-beam evaporation.

6. The method of claim 4, wherein the second layer is applied using one of spinning on, dispensing, spray coating, or inject printing.

7. The method of claim 1, further comprising patterning the wavelength-converting layer.

8. The method of claim 1, further comprising baking the wavelength-converting layer.

9. The method of claim 1, further comprising bonding a wire configured for external connection to the n-contact.

10. The method of claim 9, wherein applying the wavelength-converting layer comprises spray coating or dispensing.

11. The method of claim 1, wherein the wavelength-converting layer comprises at least a phosphor and a binding material.

12. The method of claim 1, wherein applying the wavelength-converting layer comprises maintaining a height of the wavelength-converting layer below a height of the temporary material.

13. The method of claim 1, wherein applying the wavelength-converting layer comprises covering areas of the semiconductor structure not covered by the temporary material.

14. The method of claim 1, wherein the metal substrate comprises two or more layers.

* * * * *